(12) United States Patent
Hendrix et al.

(10) Patent No.: US 10,390,386 B2
(45) Date of Patent: Aug. 20, 2019

(54) INTEGRATED CELL SITE MODULE FOR MOUNTING A REMOTE RADIO UNIT AND RADIO FREQUENCY SIGNAL CONDITIONING UNIT AS A SINGLE UNIT

(71) Applicant: CommScope Technologies LLC, Hickory, NC (US)

(72) Inventors: Walter Mark Hendrix, Richardson, TX (US); James E. Noel, Parker, TX (US); Michael J. Paulus, Dallas, TX (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 15/813,829

(22) Filed: Nov. 15, 2017

(65) Prior Publication Data
US 2018/0176985 A1    Jun. 21, 2018

Related U.S. Application Data
(60) Provisional application No. 62/435,100, filed on Dec. 16, 2016.

(51) Int. Cl.
| | |
|---|---|
| *H04W 88/04* | (2009.01) |
| *H04W 88/08* | (2009.01) |
| *H04B 1/04* | (2006.01) |
| *H05K 7/20* | (2006.01) |
| *H04W 16/24* | (2009.01) |

(52) U.S. Cl.
CPC ........ *H04W 88/085* (2013.01); *H04B 1/0475* (2013.01); *H05K 7/20545* (2013.01); *H05K 7/20563* (2013.01); *H04W 16/24* (2013.01)

(58) Field of Classification Search
CPC ...... H01Q 1/1228; H01Q 1/1242; H01Q 1/12; H01Q 1/246; H01Q 1/1207; H04Q 1/09; E04H 12/003
See application file for complete search history.

(56) References Cited

U.S. PATENT DOCUMENTS

| | | | |
|---|---|---|---|
| 9,698,477 B1 * | 7/2017 | Jabara | E04H 12/003 |
| 2001/0054983 A1 * | 12/2001 | Judd | H01Q 1/246 |
| | | | 343/810 |
| 2009/0207094 A1 * | 8/2009 | Yang | H01Q 1/125 |
| | | | 343/904 |
| 2011/0032158 A1 * | 2/2011 | Rodger | H01Q 1/02 |
| | | | 343/702 |
| 2013/0214652 A1 | 8/2013 | Mathewson | |

(Continued)

FOREIGN PATENT DOCUMENTS

KR    20120081208 A    7/2012

OTHER PUBLICATIONS

Notification of Transmittal of the International Search Report and the Written Opinion of the International Searcning Authority, or the Declaration corresponding to International Application No. PCT/US2017/061456; dated Feb. 26, 2018.

*Primary Examiner* — Devan A Sandiford
(74) *Attorney, Agent, or Firm* — Myers Bigel, P.A.

(57) ABSTRACT

A module for a communications cell site includes: a mounting frame; a remote radio unit (RRU) mounted to the frame; a radio frequency (RF) signal conditioning unit mounted to the frame; and a cover mounted to the frame that covers the RRU and the RF signal conditioning unit.

17 Claims, 6 Drawing Sheets

(56) References Cited

U.S. PATENT DOCUMENTS

| | | | |
|---|---|---|---|
| 2014/0043767 A1* | 2/2014 | Lv | H05K 7/026 |
| | | | 361/704 |
| 2014/0179244 A1* | 6/2014 | Colapietro | H04B 1/40 |
| | | | 455/90.2 |
| 2014/0315408 A1* | 10/2014 | Colapietro | H01R 13/46 |
| | | | 439/247 |
| 2015/0017937 A1* | 1/2015 | Colapietro | H01Q 1/02 |
| | | | 455/128 |
| 2015/0115117 A1* | 4/2015 | Mummert | H01Q 1/1207 |
| | | | 248/218.4 |
| 2015/0380806 A1* | 12/2015 | Wild | H01Q 1/12 |
| | | | 343/906 |
| 2016/0007488 A1* | 1/2016 | Neustadt | H01Q 1/246 |
| | | | 455/552.1 |
| 2016/0099505 A1* | 4/2016 | Junttila | H01Q 1/246 |
| | | | 455/562.1 |
| 2016/0099745 A1 | 4/2016 | Ho et al. | |
| 2016/0153609 A1* | 6/2016 | Ortel | H01Q 1/1242 |
| | | | 211/26 |
| 2016/0261030 A1* | 9/2016 | Kim | H01Q 1/246 |
| 2016/0302078 A1* | 10/2016 | Sivanandar | H01Q 1/1228 |
| 2016/0336641 A1* | 11/2016 | DiPiero | H01Q 1/1228 |
| 2016/0352042 A1* | 12/2016 | Wankoff | H01Q 1/1228 |
| 2016/0365618 A1* | 12/2016 | Kim | H01Q 1/1207 |
| 2017/0040679 A1* | 2/2017 | Frohler | H01Q 1/246 |
| 2017/0077587 A1* | 3/2017 | Fleancu | H05K 7/20409 |
| 2017/0149115 A1* | 5/2017 | Sierzenga | H01Q 1/1228 |
| 2017/0179589 A1* | 6/2017 | So | H01Q 1/42 |
| 2017/0264005 A1* | 9/2017 | Roy | H01Q 1/1228 |
| 2018/0026327 A1* | 1/2018 | Hendrix | H01Q 1/1228 |
| 2018/0108978 A1* | 4/2018 | Gonsowski | H01Q 1/42 |
| 2018/0254545 A1* | 9/2018 | Hendrix | H01Q 1/246 |

* cited by examiner

INTEGRATED CELL SITE MODULE FOR MOUNTING A REMOTE RADIO UNIT AND RADIO FREQUENCY SIGNAL CONDITIONING UNIT AS A SINGLE UNIT

FIELD OF THE INVENTION

The present application claims priority from and the benefit of U.S. Provisional Patent Application No. 62/435,100, filed Dec. 16, 2016, the disclosure of which is hereby incorporated herein in its entirety.

FIELD OF THE INVENTION

The present invention relates generally to wireless communications. In particular, it relate to improvements in wireless base station antenna and radio deployments.

BACKGROUND

One known wireless radio network system that may be mounted at the top of the tower comprises a remote radio unit (RRU) and a separate antenna. These components are mounted in separate locations and are then cabled together using jumper cables to pass radio frequency (RF) signals between them. An exemplary installation is shown in FIG. 1, wherein multiple antennas 10 are mounted on mounts 12, with RRUs 14 also mounted on the mounts 12. The mounts 12 are mounted on a tower 18. Such an installation, when done on site, may involve complex and time consuming installations, and may introduce opportunities for installation errors. For example, current installations typically require multiple jumper cables and multiple mounting kits/hardware. This involves substantial installation time (approximately 12-15 hours per site). In addition, doing this installation at the site outdoors in variable temperature and humidity conditions can adversely affect interconnect quality and overall system performance.

Also, many installations include an RF combiner, RF diplexer, and/or RF filter (shown at 16 in FIGS. 1 and 2) mounted near each RRU 14. These are collectively referred to herein as "RF signal conditioning units", and serve to condition signals being transmitted between each RRU 14 and its corresponding antenna 10. Of course, interconnection of the RF signal conditioning unit 16 with the other components introduces further opportunity for errors in installation.

SUMMARY

As a first aspect, embodiments of the invention are directed to a module for a communications cell site. The module comprises: a mounting frame; a remote radio unit (RRU) mounted to the frame; a radio frequency (RF) signal conditioning unit mounted to the frame; and a cover mounted to the frame that covers the RRU and the RF signal conditioning unit.

As a second aspect, embodiments of the invention are directed to a module for a communications cell site comprising: a mounting frame; two RRUs mounted to the frame; two RF signal conditioning units mounted to the frame; and first and second covers mounted to the frame that cover the RRUs and the RF signal conditioning units.

As a third aspect, embodiments of the invention are directed to a module for a communications cell site, comprising a mounting frame; an RRU mounted to the frame having a plurality of ports; an RF signal conditioning unit mounted to the frame having a plurality of ports; a jumper cable that interconnects one of the plurality of electrical ports on the RRU and one of the plurality of electrical ports on the RF signal conditioning unit; and a cover mounted to the frame that covers the RRU and the RF signal conditioning unit.

DETAILED DESCRIPTION

Figure 1:
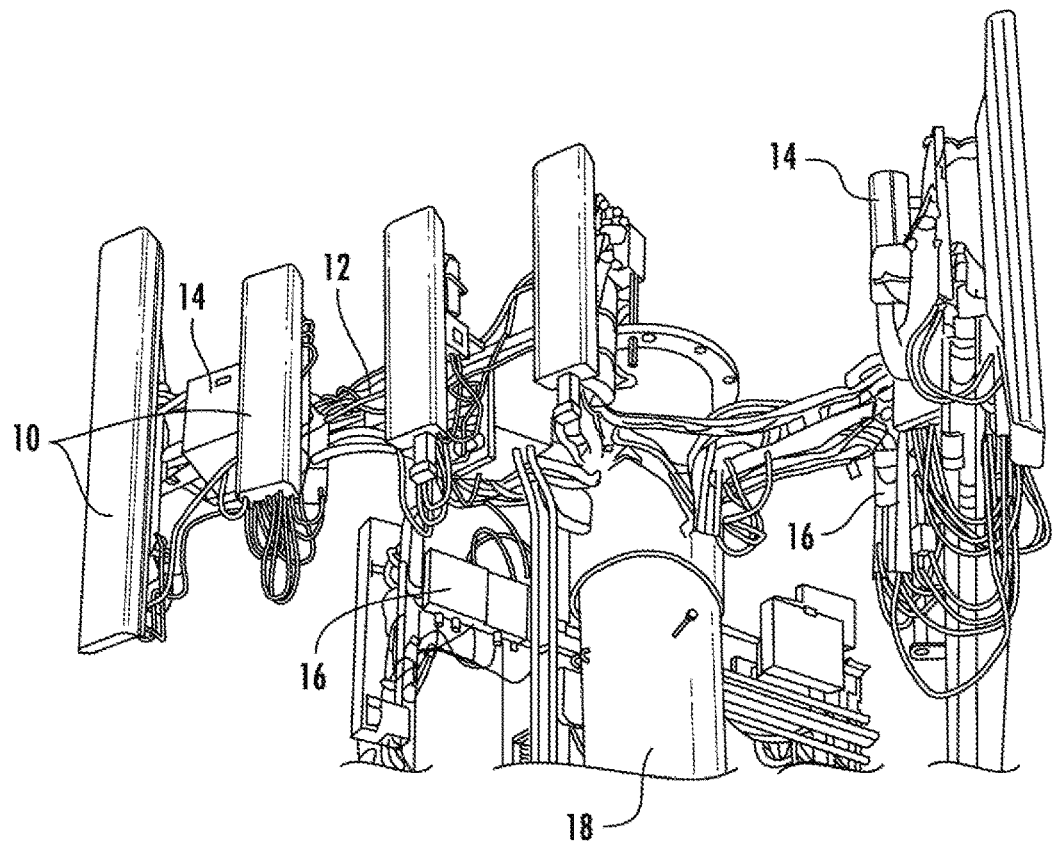
FIG. 1 is a bottom perspective view of a cell site with antennas, RRUs and RF signal conditioning units mounted on an antenna mount atop a tower.
Figure 2:
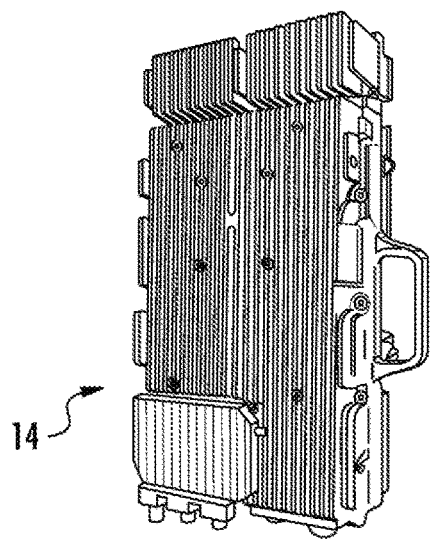
FIG. 2 is a perspective view of an exemplary RRU as shown in FIG. 1.
Figure 3:
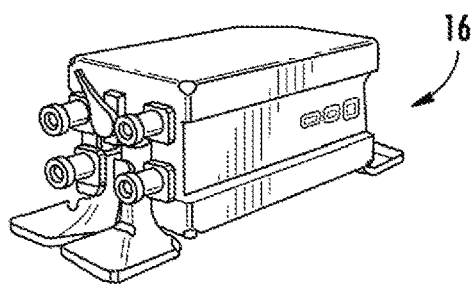
FIG. 3 is a perspective view of an exemplary RF signal conditioning unit as shown in FIG. 1.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity. Broken lines illustrate optional features or operations unless specified otherwise.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

Referring now to the figures, a telecommunications module, designated broadly at 100, is shown in FIGS. 4-10. The module includes a frame 102, two covers 104, 105, two RRUs 106, 108, and two RF signal conditioning units 110, 112. These components are described in greater detail below.

Figure 10:
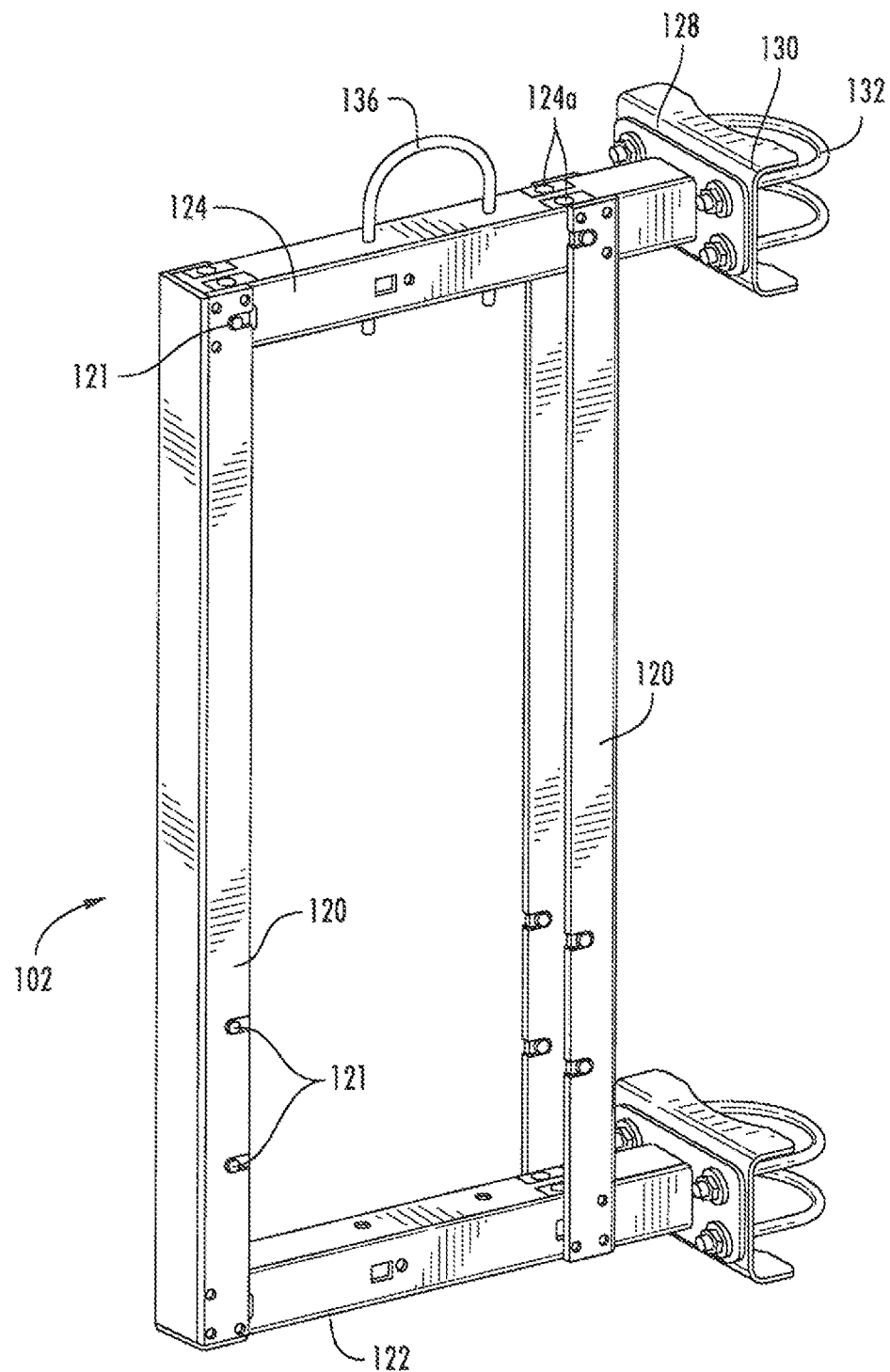
FIG. 10 is a rear perspective view of the frame of the module of FIG. 4.

Referring to FIG. 10, the frame 102 includes two vertical members 120, a lower member 122, and an upper member 124 that generally define an open rectangle. The vertical members 120 are channels with C-shaped cross-sections. The lower and upper members 122, 124 have generally square cross-sections.

The upper surface of the upper member 124 includes bumps or nubs 124a that project slightly upwardly. The lower surface of the lower member 122 has similar bumps or numb (not shown). These bumps or nubs 124a provide mounting locations for the covers 104, 105.

The members 120, 122, 124 include a number of mounting locations that can facilitate the mounting of different models of RRUs (such as the RRUs 106, 108) and RF signal conditioning units (such as the RF signal conditioning units 110, 112). In the illustrated embodiment, the mounting locations include clip nuts 121 clipped onto the members over holes in the members (not shown) that receive mounting screws. However, those of skill in this art will recognize that the RRUs 106, 108 and RF signal conditioning units 110, 112 may be mounted on the frame 102 in a variety of different ways.

Still referring to FIG. 10, each of the lower and upper members 122, 124 projects slightly from one of the vertical members 120. A mounting flange 128 is attached to the projecting end of each of the lower and upper members 122, 124. A clamp 130 with two U-bolts 132 is attached to each mounting flange 128. The 132 can be employed to attach the frame 102 to a vertical member of a mounting structure such as a mount 12 shown in FIG. 1.

Also, a lifting eye 136 is attached to the upper member 124. The lifting eye 136 can enable the module 100 to be lined by a crane or the like from the ground to the top of a tower for mounting.

The frame 102 may be formed of a number of suitable materials. Typically, the frame 102 comprises a metallic material, such as aluminum.

Figure 6:
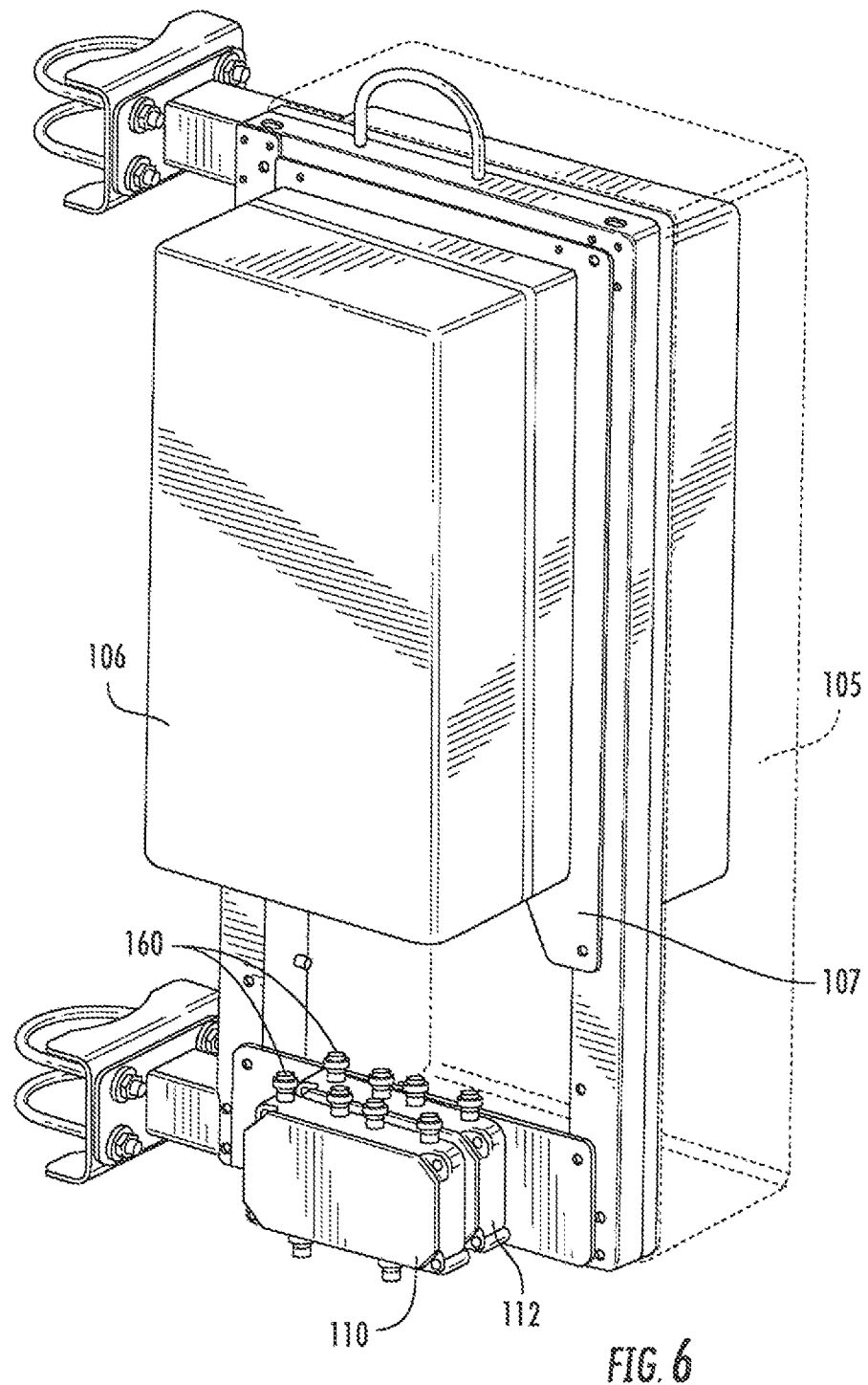
FIG. 6 is a front perspective view of the module of FIG. 4 with one of the covers removed and the RRUs shown schematically.
Figure 7:
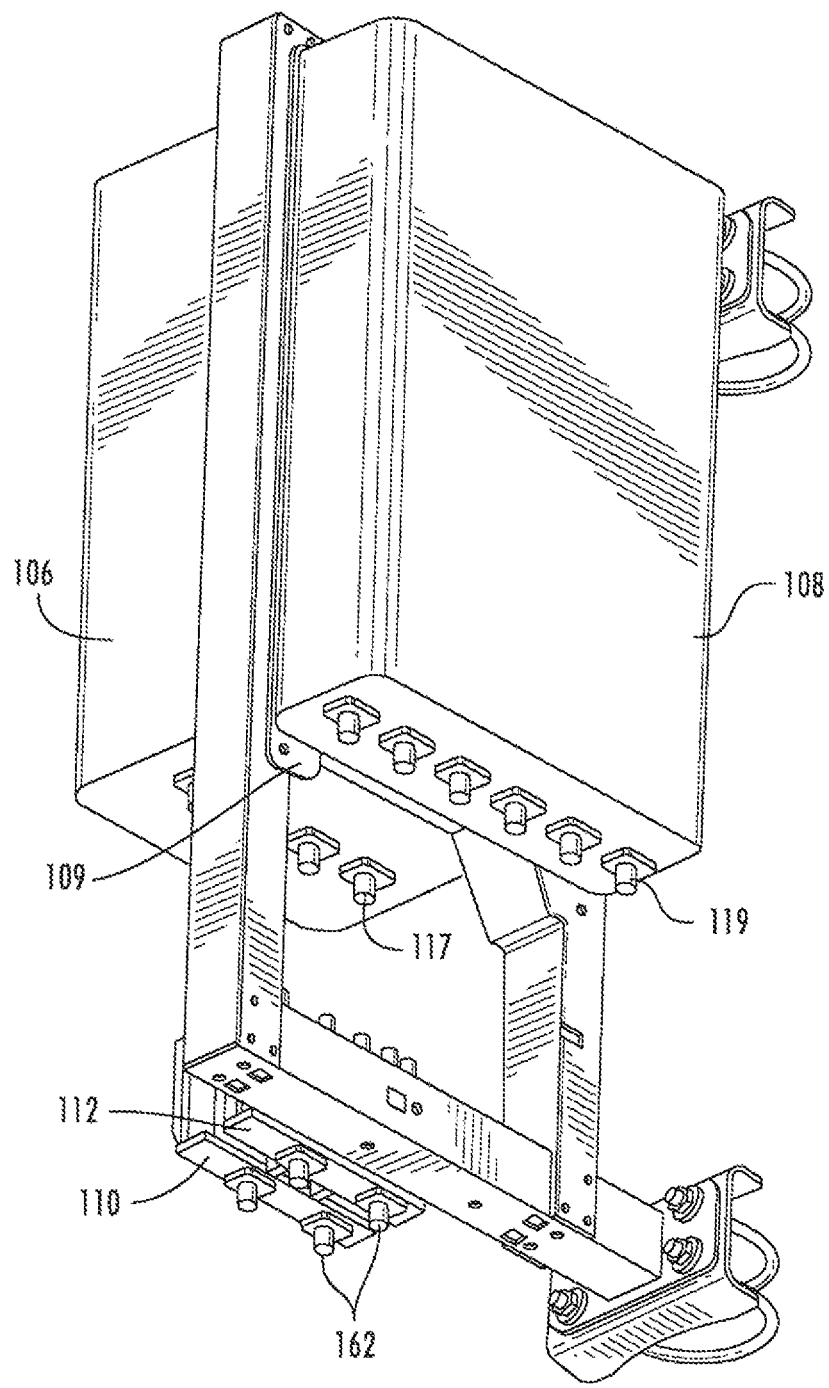
FIG. 7 is a rear perspective view of the module of FIG. 4 with both of the covers removed and the RRUs shown schematically.
Figure 8:
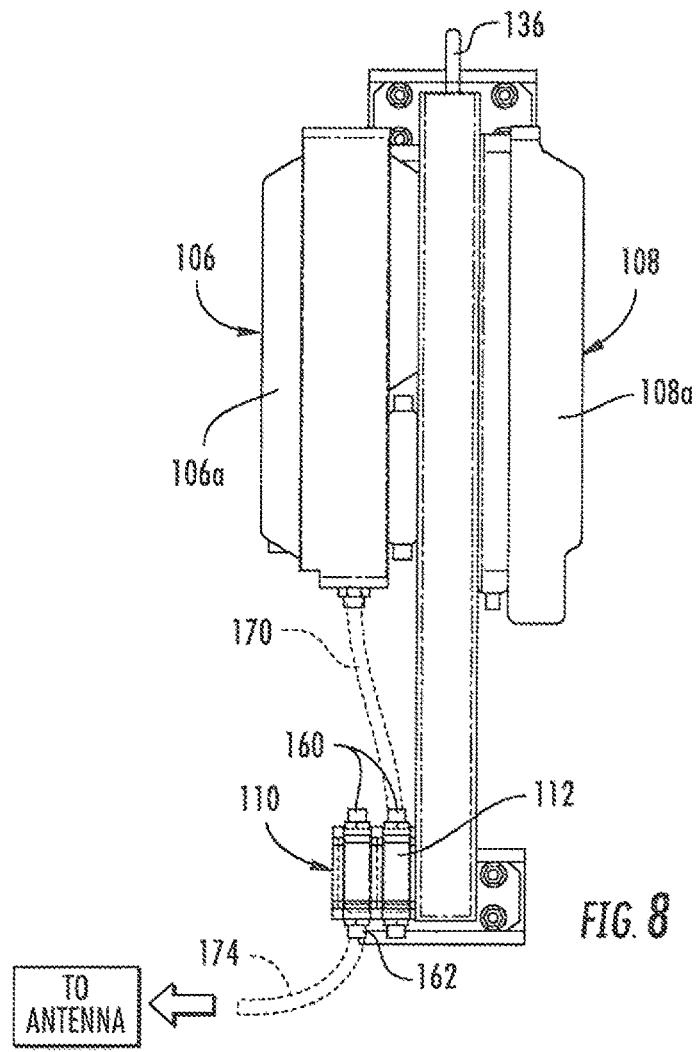
FIG. 8 is a side view of the module of FIG. 4 with both of the covers removed.

Referring to FIGS. 6-8, the RRUs 106, 108 are mounted to the frame 102. Mounting of the RRUs 106, 108 may be carried out in any suitable manner; in the illustrated embodiment, the RRUs 106, 108 are mounted to adapter plates 107, 109 that are in turn mounted to the frame 102. In the illustrated embodiment, the adapter plates 107, 109 are mounted to the frame 102 via screws or bolts inserted into the clip nuts 121 in the frame 102.

The RRUs 106, 108 may be of any variety, including FHFB and FRIS. In some embodiments, including the illustrated embodiment, the RRUs 106, 108 have external electrical ports 117, 119 that extend from the lower surfaces thereof (see FIGS. 7 and 8).

Referring still to FIGS. 6-8, the RF signal conditioning units 110, 112 are mounted to one side of a mounting panel 126. The mounting panel 126 is then mounted to the frame 102 via screws inserted into the clip nuts 121. The RF signal conditioning units 110, 112 may be any that are known to be suitable for use in antenna towers and, as noted above, may include RF filters, RF combiners and RF diplexers.

It can be seen in FIGS. 6 and 8 that the RF signal conditioning units 110, 112 have external electrical ports 160 that extend upwardly (i.e., toward the RRUs 106, 108). This arrangement of ports can facilitate the interconnection of jumper cables 170 (one is shown in broken line in FIG. 8) between the ports 117, 119 of the RRUs 106, 108 and the ports 160 of the RF signal conditioning units 110, 112. The RF signal conditioning units 110, 112 also have external ports 162 (see FIG. 7) that face downwardly (i.e., away from the RRUs 106, 108); these ports 162 connect with jumper cables 174 that connect with adjacently-mounted antennas.

Figure 4:
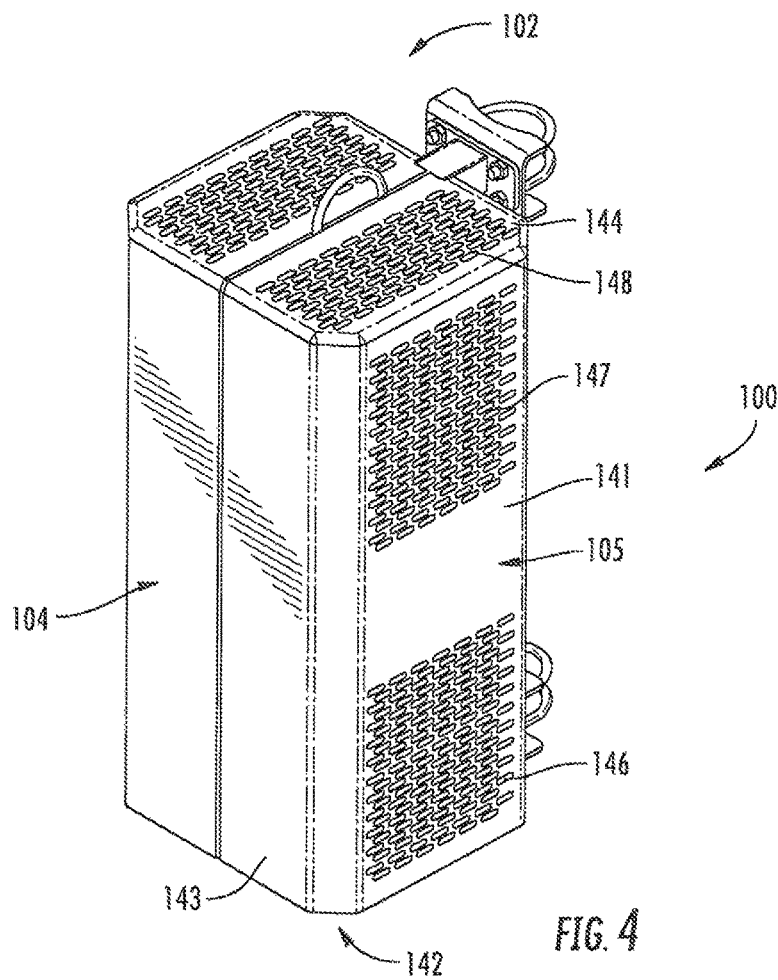
FIG. 4 is a front perspective view of a module for a cell site that includes an RRU and an RF signal conditioning unit in a single unit.
Figure 5:
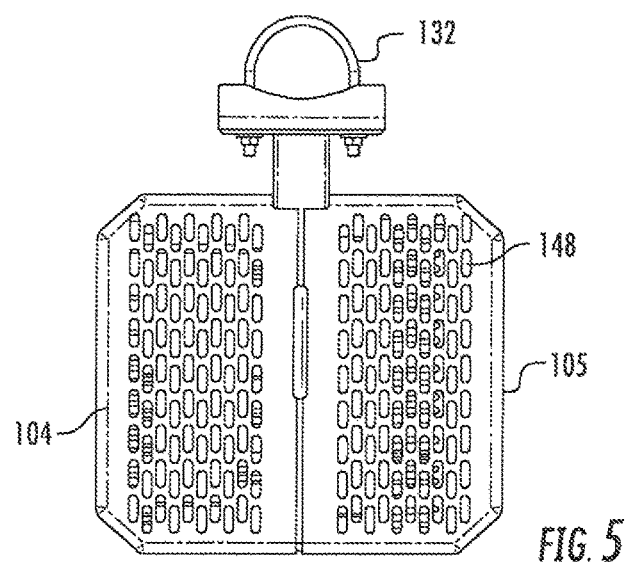
FIG. 5 is a top view of the module of FIG. 4.

As can be seen in FIGS. 4 and 5, the covers 104, 105 (which are mirror images of each other) are generally rectangular. Each cover 104, 105 has a main panel 141, a floor 142, two side walls 143, and a ceiling 144. Each cover 104, 105 includes two perforated regions 146, 147 in its main panel 141, 151, and a perforated region 148 in its ceiling 144, 154.

The covers 104, 105 may also have cutout areas that enable components of the frame to extend outside of the covers 104, 105 (e.g., the lower and upper members 122, 124 extend to present the mounting flanges 128) and/or to provide routing paths for cables (e.g., jumper cables routed between the RF signal conditioning units 110, 112 and the antenna).

The covers 104, 105 may be attached to the frame 102 in any suitable manner (e.g., via screws or bolts, clips, an interference fit, or the like). In the illustrated embodiment, the covers 104, 105 overlie the frame 102 and are held in place by the bumps or nubs 124a. The covers 104, 105 are typically formed of a metallic material such as aluminum.

Figure 9:
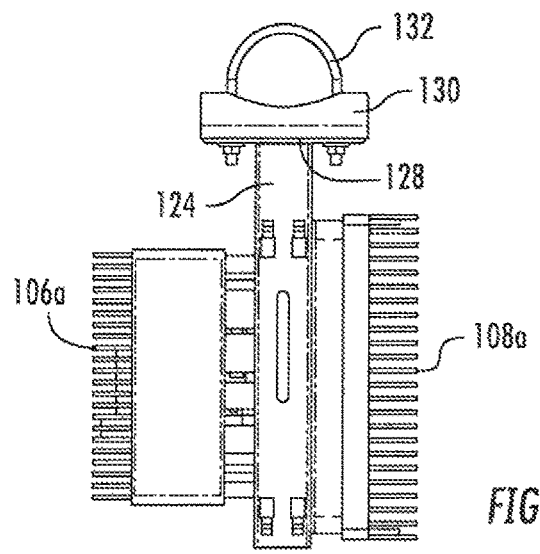
FIG. 9 is a top view of the module of FIG. 4 with both of the covers removed.

As can be seen in FIGS. 8 and 9, the RRUs 106, 108 shown therein have vertical fins 106a, 108a, which encourage heat flow in a vertical direction. Thus, air entering the cover 104 through either of the perforated regions 146, 147 is encouraged to flow upwardly by the fins 106a and to exit through the perforated region 148. This defined air flow path can passively dissipate heat that may build up within the cover 104 due to RRU operation. The perforated regions in the cover 105 may similarly define an air flow path for its adjacent RRU.

It should be noted that the module discussed above may provide several benefits over prior arrangements. Providing a subset of components mounted on the top of a tower can enable these components to be connected and tested prior to installation on the tower, which can both simplify installation and enhance reliability. The perforated regions in the covers can provide cooling to the RRUs and RF signal conditioning components through free convection. The arrangement of the RRUs and the RF signal conditioning components within the enclosure can facilitate repair and replacement, as can the attachment of the covers. Also, the use of mounting plates and adapter plates can greatly simplify replacement of the RRUs and the RF signal conditioning units; the RRUs and RF conditioning units (which may be configured differently than the units they are replacing) can be mounted on the mounting/adapter plates on the ground, and the adapter/mounting plates can be quickly and easily mounted on the frame atop the tower. Because the frame and the covers create a single module, the resulting structure may have a more appealing appearance than multiple components mounted on a tower; moreover, the single module can reduce tower leasing costs by being classified as a single unit rather than as a number of disparate components.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A module for a communications cell site, comprising:
a mounting frame having front and rear vertical members;
an adapter plate mounted to the front and rear vertical members;
a remote radio unit (RRU) mounted to the adapter plate;
a radio frequency (RF) signal conditioning unit mounted to a mounting plate, the mounting plate being mounted to the front and rear vertical members; and
a cover mounted to the frame that covers the RRU and the RF signal conditioning unit.

2. The module defined in claim 1, wherein the RRU is a first RRU and the RF signal conditioning unit is a first RF signal conditioning unit, and further comprising a second RRU and a second RF signal conditioning unit mounted to the frame.

3. The module defined in claim 1, wherein the cover includes first and second perforated regions located to guide air flow over the RRU.

4. The module defined in claim 1, wherein the RF signal conditioning unit is mounted below the RRU.

5. The module defined in claim 4, wherein the RRU has a plurality of electrical ports on a lower surface thereof, and the RF signal conditioning unit has a plurality of electrical ports on an upper surface thereof.

6. The module defined in claim 5, further comprising a jumper cable that interconnects one of the plurality of electrical ports on the RRU and one of the plurality of electrical ports on the RF signal conditioning unit.

7. The module defined in claim 1, mounted on an antenna mount on an antenna tower.

8. The module defined in claim 1, wherein the RF signal conditioning unit is electrically connected to an antenna.

9. A module for a communications cell site, comprising:
a mounting frame;
two remote radio units (RRUs) mounted to the frame;
two radio frequency (RF) signal conditioning units mounted to the frame; and
first and second covers mounted to the frame that cover the RRUs and the RF signal conditioning units;
wherein the RF signal conditioning units are mounted below the RRUs, and wherein each RRU has a plurality of electrical ports on a lower surface thereof, and each RF signal conditioning unit has a plurality of electrical ports on an upper surface thereof.

10. The module defined in claim 9, wherein each cover includes first and second perforated regions located to guide air flow over the RRUs.

11. The module defined in claim 9, further comprising a jumper cable that interconnects one of the plurality of electrical ports on each RRU and one of the plurality of electrical ports on each RF signal conditioning unit.

12. The module defined in claim 9, wherein each of the RRUs is mounted to a respective adapter plate that is in turn mounted to the frame.

13. The module defined in claim 9, mounted on an antenna mount on an antenna tower.

14. The module defined in claim 9, wherein each RF signal conditioning unit is electrically connected to an antenna.

15. A module for a communications cell site, comprising:
a mounting frame;
a remote radio unit (RRU) mounted to the frame having a plurality of ports on a lower surface thereof;
a radio frequency (RF) signal conditioning unit mounted to the frame having a plurality of ports on an upper surface thereof;
wherein the RF signal conditioning unit is mounted below the RRU;
a jumper cable that interconnects one of the plurality of electrical ports on the RRU and one of the plurality of electrical ports on the RF signal conditioning unit; and
a cover mounted to the frame that covers the RRU and the RF signal conditioning unit.

16. The module defined in claim 15, wherein the cover includes first and second perforated regions located to guide air flow over the RRU.

17. The module defined in claim 15, wherein the RRU is mounted to an adapter plate that is in turn mounted to the frame.

* * * * *